(12) United States Patent
Chen et al.

(10) Patent No.: US 8,176,620 B2
(45) Date of Patent: May 15, 2012

(54) ALUMINUM OXIDE PARTICLE STRENGTHENED NIOBIUM-TIN SUPERCONDUCTING COMPOSITE WIRE

(75) Inventors: Jingping Chen, Tallahassee, FL (US); Ke Han, Tallahassee, FL (US); Peter N. Kalu, Tallahassee, FL (US); William Markiewicz, Tallahassee, FL (US)

(73) Assignee: Florida State University Research Foundation, Tallahassee, FL (US)

( * ) Notice: Subject to any disclaimer, the term of this patent is extended or adjusted under 35 U.S.C. 154(b) by 1073 days.

(21) Appl. No.: 11/999,566

(22) Filed: Dec. 6, 2007

(65) Prior Publication Data
US 2008/0146451 A1    Jun. 19, 2008

Related U.S. Application Data

(60) Provisional application No. 60/873,082, filed on Dec. 6, 2006.

(51) Int. Cl.
*H01L 39/24* (2006.01)

(52) U.S. Cl. .............. 29/599; 505/806; 29/461; 29/868; 29/870

(58) Field of Classification Search .............. 29/461, 29/599, 868, 870; 505/230, 231, 490, 806
See application file for complete search history.

(56) References Cited

U.S. PATENT DOCUMENTS

| 3,905,839 A * | 9/1975 | Benz .............................. 148/98 |
| 4,990,411 A * | 2/1991 | Nakayama et al. ........... 428/614 |
| 5,210,071 A * | 5/1993 | LoIacono et al. ............. 505/410 |
| 7,210,216 B2 * | 5/2007 | Egawa et al. ................... 29/599 |

OTHER PUBLICATIONS

STIC search.*

* cited by examiner

*Primary Examiner* — Paul Wartalowicz
(74) *Attorney, Agent, or Firm* — J. Wiley Horton

(57) ABSTRACT

A composite superconducting wire and a method of manufacturing the wire is disclosed. Nano-particle dispersion strengthened copper is co-drawn with Niobium rod to produce DSC-1Nb wire. n numbers of DSC-1Nb wires are then stacked in a hollow DSC tube and drawn to form a DSC-n.Nb hexagonal wire. In a separate preliminary process, Tin rod is co-deformed with Copper tube to form a Cu-1Sn wire. m DSC-n Nb wires and 1 Cu-1Sn wires are then wrapped by Niobium foil and placed into a Copper tube. This entire assembly is then drawn to a finished size. The drawn composite is then subjected to heat treatment with a final stage at 650-700° C. for about 100 hours or longer. The new wire has higher electric critical current and higher mechanical strength than the controlled conventional ones.

9 Claims, 5 Drawing Sheets

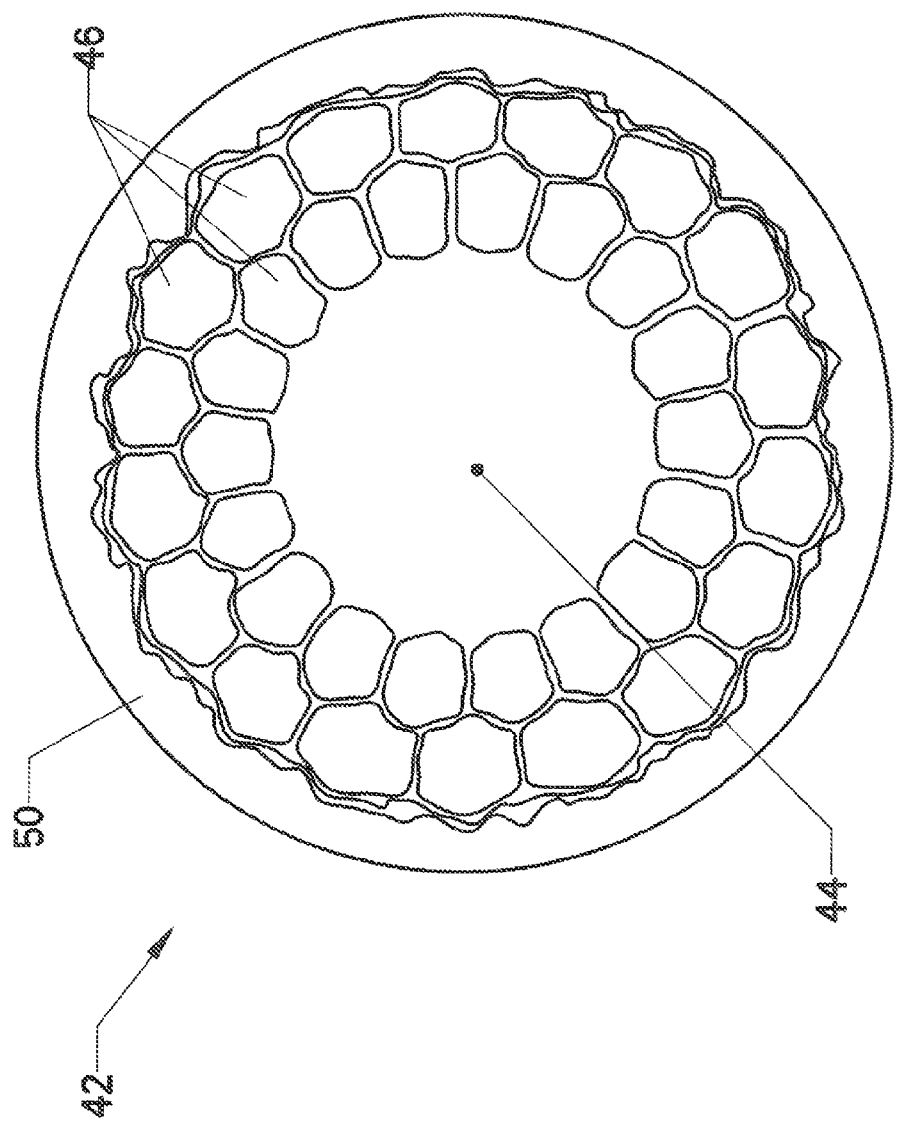

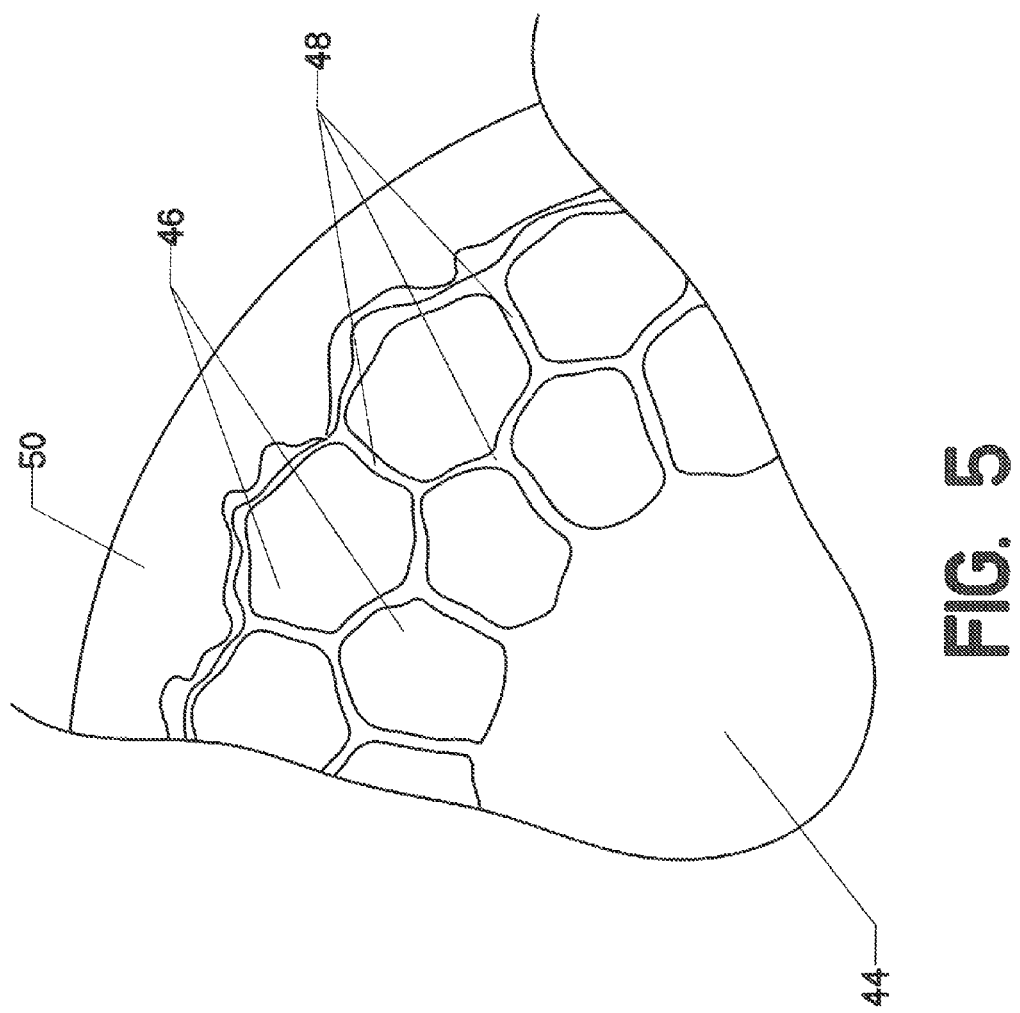

ALUMINUM OXIDE PARTICLE STRENGTHENED NIOBIUM-TIN SUPERCONDUCTING COMPOSITE WIRE

CROSS-REFERENCES TO RELATED APPLICATIONS

This non-provisional patent application claims the benefit of an earlier-filed provisional application. The provisional application listed the same inventors. It was filed on Dec. 6, 2006, and assigned Ser. No. 60/873,082.

STATEMENT REGARDING FEDERALLY SPONSORED RESEARCH OR DEVELOPMENT

This invention was developed at the National High Magnetic Field Laboratory in Tallahassee, Fla. Some of the research and development has been federally sponsored.

MICROFICHE APPENDIX

Not Applicable

BACKGROUND OF THE INVENTION

1. Field of the Invention

This invention relates to the field of conductors. More specifically, it is $Nb_3Sn$ superconducting wire having enhanced mechanical strength and critical current density compared with the unstrengthened counterpart if the heat treatment was the same for both wires.

2. Description of the Related Art

FIGS. 1 and 2 illustrate in simplified form a known method of creating composite wires. In FIG. 1, a bundle of wires 14 is placed within a hollow tube 12 to create precursor assembly 10.

In FIG. 2, precursor assembly 10 is passed through drawing die 16 to form drawn composite wire 18. The materials used to form the precursor assembly are reasonably ductile, so that when the assembly is forced through the drawing die the materials will codeform to eliminate voids and create a unified whole.

The actual processes known in the prior art are considerably more complex. For example, wires 14 shown in FIG. 1 may actually be composite wires including several dissimilar materials. These composite wires may have been formed by a prior drawing process. However, the simplified representations of FIGS. 1 and 2 ably serve to familiarize the reader with one of the known fabrication techniques in the field of superconducting wires.

Niobium-tin compounds (typically $Nb_3Sn$) are commonly used in creating superconducting wires. Such wires are useful in high-field magnets. However, during operation the conductors employed are subjected to substantial mechanical stress due to the electro-magnetic force (Lorentz forces). Niobium-tin superconductors are sensitive to mechanical strain, so the electro-magnetic force will dramatically degrade the superconducting properties, particularly the critical current ("critical current" means the maximum current the wire can carry without losing its superconducting properties) of the compound.

The second issue is that the materials need relatively long heat treatment time in order to have fully reacted Nb3Sn conductors. This results in not only consumption of energies but also complex of the fabrications.

The prior solution to the first problem has been to reinforce the niobium-tin compounds with other materials. Copper-Niobium composite, tantalum, Nb—Ti—Cu compound and Cu—Ni—Nb—Ti compound have been used to increase the mechanical strength of $Nb_3Sn$, with varying degrees of success. However, all these attempts share a common drawback: The inclusion of the reinforcing material reduces the fraction of Copper stabilizer or Non-Copper area. The reduction of the Copper stabilizer decreases the wire's overall stability and limits the practical applications of the superconductor composite wires, and the reduction of Non-Copper area decreases the critical current value.

A better solution would be to strengthen the niobium-tin wires in a way, which does not compromise the superconducting properties. The current invention presents a method which can achieve this objective. In fact, the current invented approach enhances both the mechanical strength and the crucial current of the superconductor composite wires.

The current methods also shorten the heat treatment time so that energy will be saved and fabrication procedure is simplified.

Prior fabrication approaches involve evacuation and sealing of the composite wires in a separate fabrication step in order to enhance the bounding between different components. The current approach eliminates the extra sealing step and the sealing is achieved during the co-deformation steps.

BRIEF SUMMARY OF THE INVENTION

The fabrication process is shown in FIG. 3. A Nb rod 22 was inserted into a commercial available $Al_2O_3$ nano-particle reinforced copper (DSC) tube 20. The assembly was swaged and drawn to form DSC-1Nb hexagonal wire 24. Sixty one of such hexagonal wires 24 were stacked in a DSC tube 26, and drawn to DSC-61Nb hexagonal wire 28. Meanwhile, Sn rod 30 was co-deformed with Cu tube 32 to form Cu-1 Sn hexagonal wire 34. Forty-eight of DSC-61Nb wires 28 and nineteen of Cu-1 Sn wires 34 were wrapped by Nb foil 36 and put into a Cu tube 38. The assembly was then drawn to finishing size 40, which was submitted to a serest heat treatment time and temperatures. The final reaction heat treatment was at about 650-700° C. for about 100 hours or longer.

BRIEF DESCRIPTION OF THE SEVERAL VIEWS OF THE DRAWINGS

FIG. 4 is a cross sectional view, showing a cross section of a wire made according to the present invention.

FIG. 5 is a detail view, showing an enlargement of the cross section shown in FIG. 4.

Figure 1:
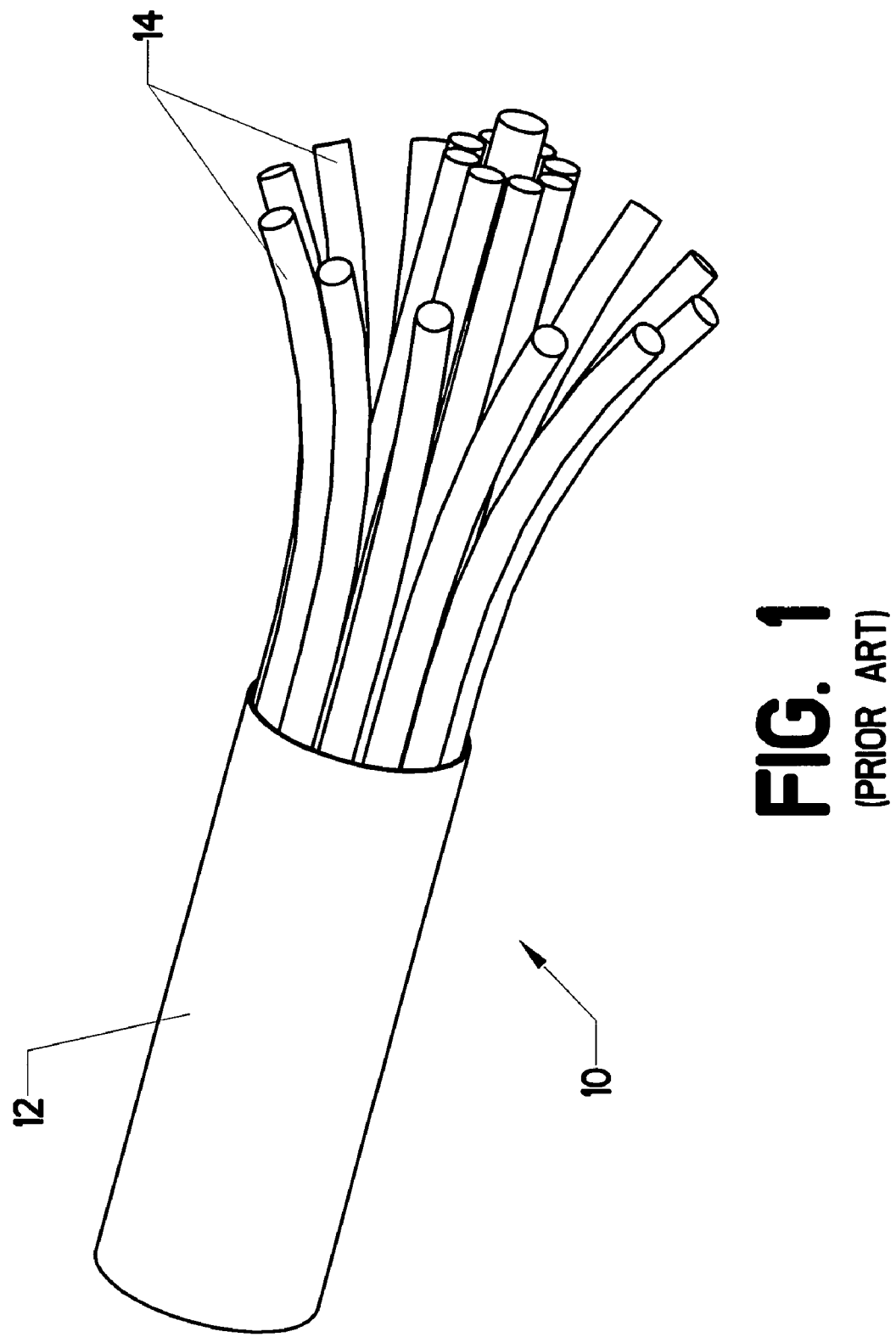
FIG. 1 is a perspective view, showing a typical fabrication process for prior art superconductive wires.
Figure 2:
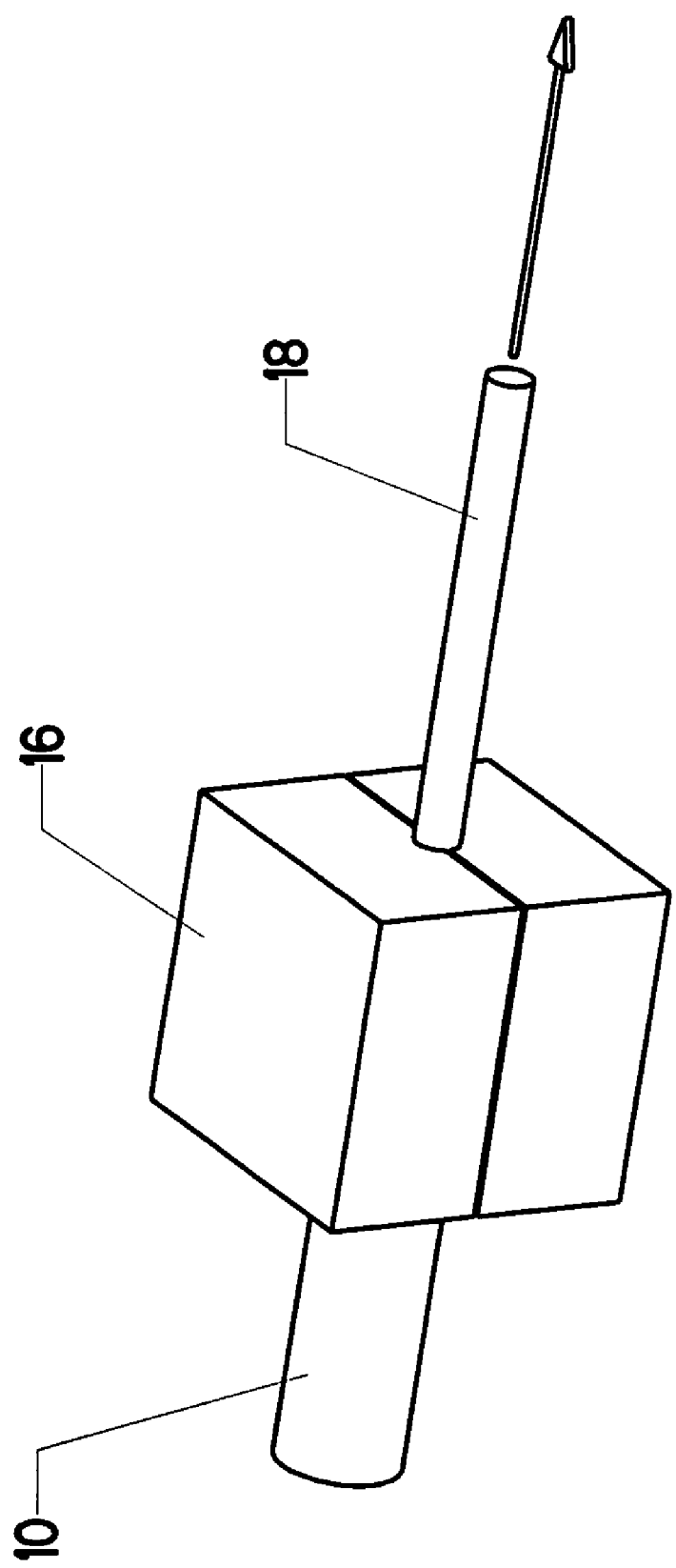
FIG. 2 is a perspective view, showing the wire of FIG. 1 being drawn through a sizing die.

| REFERENCE NUMERALS IN THE DRAWINGS | | | |
|---|---|---|---|
| 10 | precursor assembly | 12 | tube |
| 14 | wires | 16 | drawing die |
| 18 | drawn composite wire | 20 | DSC tube |
| 22 | Nb rod | 24 | DSC-1Nb hexagonal wire |
| 26 | DSC tube | 28 | DSC-61Nb hexagonal wire |
| 30 | Cu tube | 32 | Sn rod |
| 34 | Cu—1Sn hexagonal wire | 36 | Nb foil |
| 38 | Cu tube | 40 | finished product |
| 42 | cross section | 44 | copper-tin |
| 46 | niobium-tin | 48 | DSC |
| 50 | Cu stabilizer | | |

DESCRIPTION OF THE INVENTION

Al$_2$O$_3$ nano-particle reinforced copper (DSC) has good mechanical properties and excellent deformability. It retains most of its strength even after prolonged heat treatment. Commercially available C15760 is one kind of DSC, which consists of 1.1 vol % Al$_2$O$_3$ nano-particles in a Copper matrix. The size of Al$_2$O$_3$ particles is between 2-10 nm. The yield strength of C15760 at 4 K is higher than 700 MPa after 900° C. 1 h heat treatment. C15760 was used as the raw material for making reinforced Nb$_3$Sn wire. While the invention is not limited to the use of one particular alloy, the particular DSC referred to in the examples disclosed herein is C15760.

Figure 3:
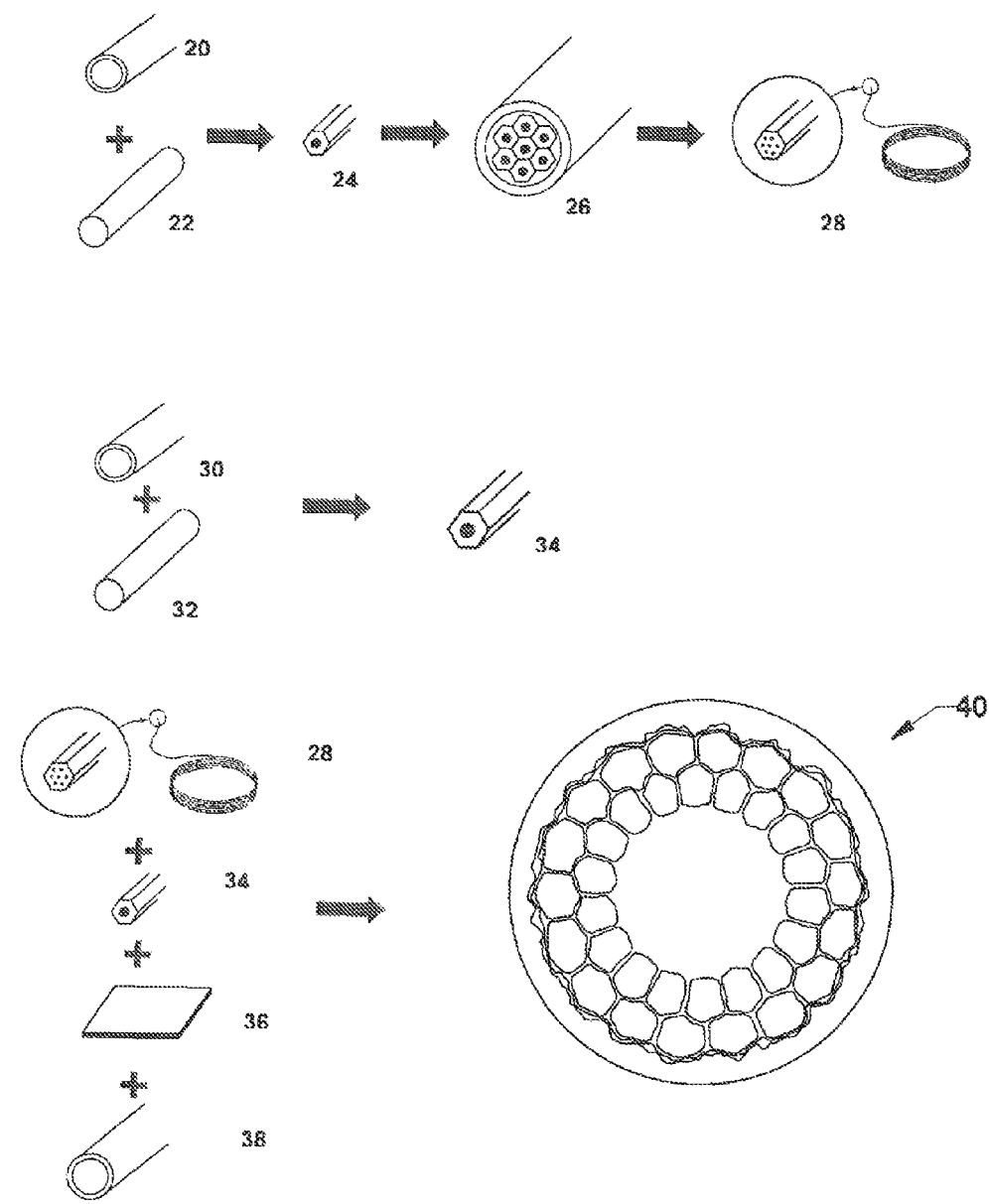
FIG. 3 is a flow chart of the fabrication process.

Returning now to FIG. 3, the fabrication process will be explained in detail. In the first step, a Nb rod 22 is inserted into DSC tube 20. The assembly is then swaged and drawn to form DSC-1Nb hexagonal wire 24. The edge-edge distance of the hexagonal wire 24 is between 1 to 2 mm. During swaging, the temperature of the work piece increases due to the deformation. The increasing temperature causes the oxidization of the DSC material's surfaces. To avoid the oxidization, one end of DSC tube is preferably sealed, while the other end is connected to a vacuum pump, which is pumping through all the swaging steps. Using this approach, the DSC tube and the Nb rod are kept in vacuum and the oxidization is minimized. This approach is simpler and less expensive than the conventional e-beam sealing+extrusion method. Before the next step of restacking and drawing, the DSC-1Nb hexagonal wire 24 is subjected to an intermediate heat treatment to recover the plasticity of the DSC-1Nb wire. A heat treatment of 600° C. for 1 hour is considered a proper annealing condition.

Next, sixty-one of hexagonal wires 24 are stacked in a DSC tube 26, and swaged/drawn to DSC-61Nb hexagonal wire 28. The use of sixty-one hexagonal wires has been found to be particularly effective, but the reader should bear in mind that the invention is not limited to any particular number of components. Other embodiments could use more or less hexagonal wires. Thus, although the term "DSC-61Nb hexagonal wire" is used to denote this intermediate product, the term should be understood to include composites having a greater or lesser number of hexagonal wires.

The edge-edge distance of the hexagonal wire 28 is preferably about 10.4 mm. For the same reasons explained previously, the assembly of hexagonal wires 24 and DSC tube 26 is preferably sealed so that a vacuum can be applied. The application of vacuum is even more important in this step, because it helps the restacked precursor wires form good bonds after deformation and heat treatment. The hexagonal wire 28 is then subjected to heat treatment of 550-750° C. for about 1 hour before the next step (restacking and drawing). Generally, the heat treatment temperature should be maintained below 750° C. A temperature higher than 750° C. can cause the Niobium to become too soft compared to DSC, and large difference in hardness between Nb and DSC will cause non-uniform deformation during subsequent swaging and drawing.

In a separate operation, a Sn rod 32 is co-deformed with a Cu tube 30 to form a Cu-1 Sn hexagonal wire 34. Because Sn is much softer than Cu, during the deformation, the Sn close to the end of Cu tube tends to be squeezed out. Correspondingly, the thickness of Cu tube in this area is preferably made thicker than the middle portions of the tube. To avoid this defect, a long Cu tube and Sn rod are preferred. After deformation, the portions of the Cu-1 Sn hexagonal wire close to the two ends are cut away and only the middle part of the Cu-1Sn hexagonal wire is kept to ensure the uniformity of the wires. The Cu-1Sn wires made in this fashion are not subjected to any heat treatment.

In the next stage of the process (still referring to FIG. 3), forty-eight DSC-61Nb wires 28 are bundled around a core of nineteen Cu-1Sn wires 34. This assembly is wrapped by Nb foil 36 and put into a Cu tube 38. The assembly is then drawn to form finished product 40. The finished product is then submitted to a final reaction heat treatment at about 650-700° C. for 100 hours or longer. Sealing and vacuum are preferably applied in this step too.

Because the DSC-61Nb wires are much harder than Cu-1Sn wires, the Cu-1Sn wires are preferably placed in the center with the DSC-61Nb wires surrounding the Cu-1Sn wires (in order to reach a symmetric stress-strain state of deformation). This arrangement of precursor wires ensures the uniform deformation. The uniformity of Nb filament shape is important to the superconducting properties. In this final step, swaging is limited due to the risk of non-uniform deformations (which can produce breakage or "sausaging" of Nb filaments).

The final reaction heat treatment is preferably carried out in a tube furnace with flowing Argon protection. Because the Sn filaments in the wire will melt during the heat treatment, it may flow away through the two ends of the wire. To prevent this from happening, the two ends of unreacted wire are put in the cold area of the furnace, where the temperature is lower than Sn's melting point. By this way, all melted Sn is kept inside the wire.

A cross sectional view of the completed product is shown in FIG. 4. The niobium tin filaments and DSC matrix 46 surround a core of copper-tin 44. A surrounding layer of copper 50 encompasses the other components. FIG. 5 shows a more detailed view of the same assembly. The reader will observe that each niobium-tin/DSC component 46 is surrounded by DSC 48. An example of the finished specification of the DSC reinforced Nb$_3$Sn wire is presented in the following table:

TABLE I

| | |
|---|---|
| Wire diameter | 0.555 mm |
| Filament diameter | 5-10 μm |
| Number of filaments | 2562 |
| Filament composition | Nb |
| Cu/non-Cu ratio | 0.1-0.5 |
| DSC/non-Cu ratio | 0.3-0.5 |
| Barrier material | Nb |
| Heat treatment | 660° C. 100 h or longer |

The finished product was tested against an identically prepared wire, which was made by substituting copper for dispersion-strengthened copper in the co-deformation process with niobium. The critical current of the two samples was measured at increasing levels of strain. The sample made according to the present inventive process ("the DSC sample") was able to carry significantly more current than the control sample between 0% strain and about 0.3% strain. The test was conducted in an 18 T magnetic field at a temperature of 4.2 K. The maximum current density for the DSC sample was 86 A/mm$^2$, while the non-DSC sample achieved only 67A/mm$^2$. The addition of the nano-scaled aluminum oxide particles thereby increased the critical current by 28%.

Further optimization of the fabrication can further enhance the critical current densities. One possible reason for the enhanced current carrying ability is that the nano-scaled aluminum oxide particles may reduce the grain size of Nb$_3$Sn phase. The other possibility is that the grain sizes of the Cu—Sn in the strengthened wire is smaller than that of the controlled wires. The refined grain sizes are due to the pinning effects of the nano-particles. The refined grain sizes assists the grain boundary diffusion so that the strengthened wires have more fully reacted Nb3Sn than is found in the prior art. In order to verify this phenomenon, several experiments were undertaken using longer heat treatments. In these experiments, the critical current of the strengthened wire was still significantly higher than the prior art. Therefore, the refined grain size in $Nb_3Sn$ plays a role.

As expected, the use of the DSC to strengthen the components enhances the wire's mechanical properties. The 0.2% yield stresses for the DSC versus non-DSC samples are about 220 MPa and 200 MPa respectively. Thus, adding the nano-$Al_2O_3$ particles produces about a 10% increase in strength. The strengthening is highly dependent upon the volume fraction of $Nb_3Sn$ and DSC. Generally, decreasing of $Nb_3Sn$'s fraction and increasing of DSC's fraction result in higher strengthening effect.

While the strengthening effect is not surprising the increase in critical current carrying capacity is quite surprising. Those skilled in the art will know that adding strengthening alloying agents typically decreases conductivity. The fact that the present inventive process actually increases conductivity is a significant feature.

Examination of the microstructure indicates that the reaction rate in the DSC wires is faster than for the prior art. This indicates that the DSC wires can be manufactured using shorter periods of heat treatment. This fact saves considerable energy in mass production.

Another significant feature of the present design is the placement of the DSC immediately adjacent to the $Nb_3Sn$ filaments. Since DSC has a high thermal contraction rate and high yield strength, it exerts large compression forces on the $Nb_3Sn$ filaments during cooling (compressive prestrain). The prestrain depends on the volume fraction of DSC in the composite wire. Because in this new design (DSC reinforced $Nb_3Sn$ wire), the volume fraction of Cu stabilizer, CuSn matrix and $Nb_3Sn$ filaments are the same as traditional non-strengthened wire, the changed prestrain value upon the DSC's fraction means that prestrain becomes adjustable without impairing all the other properties. This feature has significant meaning in magnet design since prestrain is an important factor considered by magnet designers.

In conclusion, the present invention establishes that DSC can be co-deformed with niobium, assuming suitable process parameters are maintained. A DSC-$Nb_3Sn$ wire can be made using this process, which exhibits enhanced mechanical properties and enhanced critical current capacity. The present invention simplifies the fabrication procedure for the low temperature superconductor manufacturing and also shortens the heat treatment time so that the a DSC-$Nb_3Sn$ wire saves the energy for production.

Although the preceding description contains significant detail, it should be viewed as providing explanations of only some of the many possible embodiments of the present invention. Thus, the scope of the invention should be fixed by the claims rather than any specific example given.

The invention claimed is:
1. A method of manufacturing a superconducting composite wire, comprising:
 a. providing a plurality of niobium rods;
 b. providing a first plurality of aluminum oxide nano-particle reinforced copper tubes;
 c. inserting each of said plurality of niobium rods into one of said first plurality of aluminum oxide nano-particle reinforced copper tubes to form a plurality of first assemblies;
 d. swaging and drawing each of said plurality of first assemblies to form a plurality of DSC-1Nb hexagonal wires;
 e. providing a second plurality of aluminum oxide nano-particle reinforced copper tubes;
 f. inserting each of said plurality of DSC-1Nb hexagonal wires into one of said second plurality of aluminum oxide nano-particle reinforced copper tubes to form a plurality of second assemblies;
 g. swaging and drawing said plurality of second assemblies to form a plurality of DSC-61Nb hexagonal wires;
 h. providing a plurality of tin rods;
 i. providing a third plurality of copper tubes;
 j. inserting each of said plurality of tin rods into one of said third plurality of copper tubes to form a plurality of third assemblies;
 k. deforming each of said plurality of third assemblies to form a plurality of Cu-1Sn hexagonal wires;
 l. providing a piece of niobium foil;
 m. providing an additional copper tube;
 n. bundling said plurality of Cu-1Sn hexagonal wires together to form a core;
 o. arranging said plurality of DSC-61Nb hexagonal wires around said core;
 p. wrapping said piece of niobium foil around said plurality of DSC-61Nb hexagonal wires;
 q. placing said core, said plurality of DSC-61Nb hexagonal wires, and said piece of niobium foil into said additional copper tube to form a fourth assembly; and
 r. drawing said fourth assembly to create said superconducting composite wire.

2. A method of manufacturing a superconducting composite wire as recited in claim 1, wherein:
 a. each of said plurality of first assemblies has a first end and a second end; and
 b. during said swaging and drawing of each of said plurality of first assemblies, said first end is sealed and said second end is connected to a vacuum pump.

3. A method of manufacturing a superconducting composite wire as recited in claim 1, wherein:
 a. each of said plurality of second assemblies has a first end and a second end; and
 b. during said swaging and drawing of each of said plurality of second assemblies, said first end is sealed and said second end is connected to a vacuum pump.

4. A method of manufacturing a superconducting composite wire as recited in claim 1, wherein after each of said plurality of first assemblies is swaged and drawn, said plurality of first assemblies is subjected to a heat treatment at about 600 degrees Celsius.

5. A method of manufacturing a superconducting composite wire as recited in claim 4, wherein after each of said plurality of second assemblies is swaged and drawn, said plurality of second assemblies is subjected to a heat treatment between about 550 and 750 degrees Celsius.

6. A method of manufacturing a superconducting composite wire as recited in claim 5, wherein after said superconducting composite wire is created, said superconducting composite wire is subjected to a heat treatment between about 650 and 700 degrees Celsius.

7. A method of manufacturing a superconducting composite wire as recited in claim 6, wherein said heat treatment of said superconducting composite wire is conducted in a tube furnace with flowing argon protection.

8. A method of manufacturing a superconducting composite wire as recited in claim 6, wherein:
   a. said superconducting composite wire has a first end, a second end, and a middle portion; and
   b. during said heat treatment of said superconducting composite wire, the temperature of said first and second ends are maintained below the melting temperature of tin, but the temperature of said middle portion is maintained between about 650 and 700 degrees Celsius.

9. A method of manufacturing a superconducting composite wire as recited in claim 7, wherein:
   a. said superconducting composite wire has a first end, a second end, and a middle portion; and
   b. during said heat treatment of said superconducting composite wire, the temperature of said first and second ends are maintained below the melting temperature of tin, but the temperature of said middle portion is maintained between about 650 and 700 degrees Celsius.

* * * * *